(12) United States Patent
Kawakami et al.

(10) Patent No.: US 6,396,858 B2
(45) Date of Patent: *May 28, 2002

(54) LASER DRIVING METHOD AND APPARATUS AND IMAGE-FORMING APPARATUS

(75) Inventors: Takayuki Kawakami, Numazu; Tomobumi Nakayama, deceased, late of Tokyo, by Kazumi Nakayama, legal representative; Isamu Sato, Mishima; Tatsuhito Kataoka, Numazu; Katsuhide Koga; Yukio Yokoyama, both of Mishima, all of (JP)

(73) Assignee: Canon Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/257,934

(22) Filed: Feb. 26, 1999

(30) Foreign Application Priority Data

Mar. 2, 1998 (JP) .............................. 10-049537

(51) Int. Cl.$^7$ .............................. H01S 3/13; H01S 3/00; G01S 1/32
(52) U.S. Cl. .............................. 372/38.02; 372/29.015; 250/205
(58) Field of Search .............................. 372/38.02, 38.07, 372/24.071, 29.015; 250/205, 234, 236

(56) References Cited

U.S. PATENT DOCUMENTS

| 5,731,831 A | 3/1998 | Murabe et al. |
| 5,835,124 A | 11/1998 | Fukita et al. |
| 5,965,869 A | * 10/1999 | Masuda et al. ............. 250/205 |

* cited by examiner

Primary Examiner—Frank G. Font
Assistant Examiner—Amando Rodriguez
(74) Attorney, Agent, or Firm—Fitzpatrick, Cella, Harper & Scinto

(57) ABSTRACT

A laser driving method is adapted for driving a plurality of laser emitting devices. A first current to be supplied to each of the plurality of laser emitting devices is always generated. A plurality of second currents controlled according to a control signal supplied from the outside are generated when necessary. The plurality of second currents are supplied to the respective laser emitting devices under supply of the respective first currents, thereby making the laser emitting devices emit respective laser beams. The plurality of laser emitting devices are caused to emit the laser beams in time division at predetermined timing to detect each of emitted light amounts by one laser monitor. Adjustment is made to at least one of the first current and the second current supplied to each of the laser emitting devices according to a plurality of detected light amounts detected. Supply of the current to the laser emitting devices not driven is stopped when the plurality of laser emitting devices are adjusted in light amount in time division.

7 Claims, 7 Drawing Sheets

LASER DRIVING METHOD AND APPARATUS AND IMAGE-FORMING APPARATUS

BACKGROUND OF THE INVENTION

1. Field of the Invention

The present invention relates to a laser driving method and apparatus for making a laser emitting device emit a laser beam controlled according to a control signal and to an image-forming apparatus of an electrophotographic method making use of the laser driving apparatus for emitting the laser beam by the laser driving method.

2. Related Background Art

The conventional image-forming apparatus of the electrophotographic method such as laser printers or the like are provided with the laser driving apparatus and this laser driving apparatus emits the laser beam according to image data. The laser driving apparatus of this type is provided, for example, with a semiconductor laser as laser emitting means and a pulse current is supplied to this semiconductor laser, whereupon the semiconductor laser emits the laser beam in a light amount according to the current.

At this time, the laser beam emitted from the semiconductor laser is controlled according to the image data and this laser beam is deflected by a rotating polygon mirror or the like to scan in the main scanning direction. At the same time as it, a photosensitive drum as latent image carrying means is rotated to move a peripheral surface thereof at an exposure position in the sub-scanning direction and the peripheral surface of the photosensitive drum moving in the sub-scanning direction is charged by a charging charger.

The peripheral surface of the photosensitive drum rotating in the sub-scanning direction as being charged is exposed to and scanned with the laser beam thus deflected to scan, so as to form an electrostatic latent image thereon and this electrostatic latent image is developed with toner by a developing device as latent image developing means. The toner on the peripheral surface of the photosensitive drum, thus developed, is transferred onto a recording medium by a transfer charger as toner transferring means and the toner transferred onto the recording medium is fixed by a fixing device as toner fixing means.

Some of the image-forming apparatus described above are arranged to always supply a current near a laser emission threshold to the semiconductor laser and supply a pulse current or a bias current controlled according to the image data when necessary. Since a photodiode to function as laser monitor means is usually integrated in the semiconductor laser, it is also normal practice to monitor the amount of emitted light from the semiconductor laser by this photodiode and maintain the laser light amount constant by adjusting the bias current or the pulse current.

A conventional example of the image-forming apparatus as described above will be explained referring to FIG. 1 to FIG. 3. FIG. 1 is a schematic block diagram to show the main part of the image-forming apparatus, FIG. 2 is a schematic plan view to show part of an optical system of the image-forming apparatus, and FIG. 3 is a time chart to show the relation among various signals.

First, the image-forming apparatus 1 of this conventional example has a laser device 2, as illustrated in FIG. 1, and this laser device 2 is constructed in an integral form comprised of a semiconductor laser 3 as laser emitting means and a photodiode 4 as laser monitor means. The semiconductor laser 3 emits the laser beam in response to supply of current, and the photodiode 4 monitors the laser beam emitted from the semiconductor laser 3 and outputs a current signal according to the light amount of the laser beam.

Connected to the laser device 2 are a power supply 5 of the main body and a laser driver 6, and this laser driver 6 incorporates a pulse current source 7 being pulse supply means, a bias current source 8 being bias supply means, and an APC (Automatic Power Control) circuit 9 being current adjusting means.

The two current sources 7, 8 are connected in parallel to one semiconductor laser 3, the pulse current source 7 being connected directly to the semiconductor laser 3 while the bias current source 8 being connected via a high-speed analog switch 10, such as a CMOS (Complementary Metal Oxide Semiconductor) or the like, to the semiconductor laser 3.

The pulse current source 7 generates a pulse current and supply it to the semiconductor laser 3, whereas the bias current source 8 supplies a bias current controlled by on/off of the analog switch 10 according to a control signal supplied from the outside, to the semiconductor laser 3 when necessary.

The APC circuit 9 is connected to the photodiode 4 and to the pulse current source 7 and adjusts the pulse current of the pulse current source 7 according to the result of detection by the photodiode 4. More specifically, the APC circuit 9 is comprised of a current-voltage converter 11, a sample hold circuit 12, a constant voltage supply 13, a comparator 14, etc., and converts a current sinal outputted from the photodiode 4 to a voltage signal by the current-voltage converter 11.

The sample hold circuit 12 samples and holds the voltage signal from the current-voltage converter 11 at predetermined timing and the comparator 14 compares the hold voltage of the sample hold circuit 12 with a reference voltage of the constant voltage supply 13 to increase or decrease the pulse current generated from the pulse current source 7.

An image processing circuit 15 being signal input means is connected to the analog switch 10, which is connected to the bias current source 8, and a system controller 16 is connected to this image processing circuit 15. The image processing circuit 15 switches the analog switch 10 on and off, using image data supplied as a control signal from the outside, and the system controller 16 systematically controls the circuits including the image processing circuit 15 etc.

A reflective surface of a polygon mirror 21 being beam deflecting means is located through a collimator lens 20 on the optical axis of the semiconductor laser 3 of the laser device 2, as illustrated in FIG. 2, and the peripheral surface of a photosensitive drum 23 being the latent image carrying means is located, for example, through a correction optical system 22 of an fθ lens or the like on the reflected light path of this polygon mirror 21.

The polygon mirror 21 is rotatably supported by a scanner motor (not illustrated) and deflects the laser beam emitted from the semiconductor laser 3 to effect scanning in the main scanning direction. The photosensitive drum 23 is rotatably supported by a drum driving mechanism (not illustrated) being sub-scanning means and the peripheral surface thereof exposed to and scanned with the laser beam is relatively moved in the sub-scanning direction.

A BD (Beam Detect) sensor 24 being beam detecting means is placed at a forward position in the main scanning direction with respect to the photosensitive drum 23 in the scanning range of the polygon mirror 21 and this BD sensor 24 detects the laser beam under deflection scanning by the polygon mirror 21 immediately before irradiation of the photosensitive drum 23 therewith.

The BD sensor 24 is also connected, for example, through an amplifier (not illustrated) or the like to the system controller 16 and this system controller 16 controls the operation of the image processing circuit 15, the APC circuit 9, etc. according to the timing of detection of the laser beam by the BD sensor 24 and the like.

In that case, as illustrated in (b) in FIG. 3, during the time period "$T_1$ to $T_2$" of initial setting, the analog switch 10 is kept continuously on by the data signal being a control signal of the image processing circuit 15, to make the bias current source 8 and the pulse current source 7 supply the respective currents to the semiconductor laser 3, thereby making the semiconductor laser 3 continuously emit the laser beam.

At this time, because the voltage according to the emitted light amount of the laser beam continuously emitted from the semiconductor laser 3 is sampled by the sample hold circuit 12 in the APC circuit 9 as illustrated in (c) in FIG. 3, the pulse current $I_T$ of the pulse current source 7 is initially set according to the voltage sampled by this sample hold circuit 12 as illustrated in (a) in FIG. 3.

After completion of the initial setting as described above, the deflection scanning with the laser beam is started with rotational driving of the polygon mirror 21 and the pulse current source 7 is finely adjusted every main scanning line by the APC circuit 9 during the time period "$T_3$ to $T_4$" immediately before the laser beam under the deflection scanning is detected by the BD sensor 24.

During the time period "$T_5$ to $T_6$" immediately after it, the laser beam under the deflection scanning is detected by the BD sensor 24 and after a lapse of a predetermined time from this beam detection, the laser beam starts exposure and scanning of the image area of the photosensitive drum 23. In this case, the image processing circuit 15 controls on/off of the analog switch 10 according to the image data to make the bias current source 8 and the pulse current source 7 supply the bias current and the pulse current to the semiconductor laser 3 so as to make the semiconductor laser 3 emit the laser beam controlled according to the image data.

Although omitted from the illustration and description because of the generally known structure, various devices, including a charging charger as carrier charging means, a developing device as latent image developing means, a transfer charger as toner transferring means, and so on, in addition to the laser scanning mechanism described above, are opposed to the peripheral surface of the photosensitive drum 23 and a conveyance passage of a print sheet being a recording medium is also created in a gap between the transfer charger and the photosensitive drum 23.

The image-forming apparatus 1 of the above-stated structure can form an image by the electrophotographic method.

Since the image processing circuit 15 controls on/off of the analog switch 10 of the bias current source 8 according to the image data while the pulse current source 7 supplies the pulse current to the semiconductor laser 3, this causes the semiconductor laser 3 to emit the laser beam controlled according to the image data.

The laser beam thus emitted according to the image data from the semiconductor laser 3 is deflected by the rotating polygon mirror 21 to scan in the main scanning direction and irradiate the peripheral surface of the photosensitive drum 23 rotating in the sub-scanning direction, whereby an electrostatic latent image is formed thereon in the form of a lot of main scanning lines.

At this time, the laser beam under the deflection scanning is detected by the BD sensor 24 immediately before the irradiation of the photosensitive drum 23. Emission of the laser beam according to the image data is started at a predetermined time after the detection of the beam by the BD sensor 24, whereby start positions of the many main scanning lines continuous in the sub-scanning direction can be aligned.

Since the laser beam needs to be detected by the BD sensor 24 prior to the image scanning as described above, the semiconductor laser 3 is driven by the system controller 16 and the image processing circuit 15 at the timing when the laser beam under the deflection scanning irradiates the BD sensor 24.

The semiconductor laser 3 is also driven for the APC operation immediately before the BD sensor 24 detects the laser beam. The emitted light amount of the laser beam is detected by the photodiode 4 and the pulse current from the pulse current source 7 is adjusted by the APC circuit 9 of the laser driver 6.

Since in the above-stated image-forming apparatus 1 the pulse current is adjusted so as to keep constant the emitted light amount of the laser beam emitted from the semiconductor laser 3, the image can be formed with good quality. Further, because the bias current controlled according to the image data is supplied while the pulse current is supplied to the semiconductor laser 3, the image can be formed at high speed with the semiconductor laser 3 being driven in good response. The image-forming apparatus described above is arranged to adjust the pulse current, but it can also be contemplated, conversely, that the bias current is adjusted to keep the emitted light amount of the laser beam constant.

The image-forming apparatus 1 described above is arranged to enhance the response of the semiconductor laser 3 so as to perform the image formation at high speed by supplying the bias current controlled according to the image data to the semiconductor laser 3 under supply of the pulse current, and it is now under research to simultaneously form plural main scanning lines using a plurality of semiconductor lasers in the laser device in order to further increase the speed of image formation of the image-forming apparatus.

In general, even if the laser device is comprised of a plurality of semiconductor lasers as described above, it is preferable to use only one photodiode in terms of productivity and scale reduction. For detecting amounts of emitted light from the respective semiconductor lasers in order to adjust the pulse current or the bias current, one photodiode is arranged to detect each of the emitted light amounts while the semiconductor lasers are driven in order.

However, where the current near the laser emission threshold is always supplied to the plural semiconductor lasers by use of the pulse current and the bias current in order to enhance the response as described above, this current near the threshold sometimes causes a semiconductor laser in a non-driven state to emit a small amount of light, which does not allow accurate detection of the emitted light amount of the semiconductor laser in a driven state. This results in failing to properly adjust the bias currents of the plural semiconductor lasers, thereby degrading the quality of the image formed by the image-forming apparatus.

SUMMARY OF THE INVENTION

The present invention has been accomplished in view of the above-stated issue and an object of the present invention is to provide a laser driving method and apparatus capable of accurately detecting and correcting emitted light amounts of plural laser emitting means under supply of the pulse current and bias current by one laser monitor means, and also to provide an image-forming apparatus capable of forming an image with high quality.

A laser driving method of the present invention is a laser driving method comprising steps of always generating a first current to be supplied to each of plural laser emitting means, generating plural second currents controlled according to a control signal supplied from the outside, when necessary, supplying these plural second currents to the respective laser emitting means under supply of the respective first currents to make the plural laser emitting means emit respective laser beams, making these plural laser emitting means emit the laser beams in time division at predetermined timing and making one laser monitor means detect each of emitted light amounts, and adjusting at least one of the first current and the second current supplied to each of the plural laser emitting means according to these light amounts detected, wherein supply of the current to the laser emitting means not driven is stopped when the plural laser emitting means are adjusted in light amount in time division.

Therefore, the current is not supplied to the laser emitting means not driven when the plural laser emitting means are adjusted in light amount in time division and one laser monitor means detects the laser light amounts, so that when only one of the plural laser emitting means is driven for the measurement of light amount, the laser emitting means not driven are prevented from emitting a small amount of light.

A laser driving apparatus of the present invention comprises: signal input means through which a control signal is supplied from the outside; a plurality of second current supply means for generating a second current controlled according to the control signal supplied from the outside through said signal input means, when necessary; a plurality of first current supply means for always generating a first current; a plurality of laser emitting means for individually emitting a laser beam according to the second current and the first current supplied respectively from either of said plurality of second current supply means and from either of said plurality of first current supply means; driving means for making said plurality of second current supply means generate the predetermined second current at predetermined timing to make said plurality of laser emitting means emit respective laser beams in time division; one laser monitor means for monitoring each of the laser beams which said driving means makes said plurality of laser emitting means emit in time division, to detect emitted light amounts of the respective laser beams; current adjusting means for individually adjusting an output current from at least either said first current supply means or said second current supply means according to a plurality of detection results of said laser monitor means; and current control means for stopping supply of the current to the laser emitting means not driven when said driving means drives said plurality of laser emitting means in time division.

When the control signal is supplied from the outside into the signal input means, the plurality of second current supply means generate the second currents controlled according to this control signal, when necessary. At this time the plurality of first current supply means always generate the first currents and thus the plural laser emitting means emit the respective laser beams according to the second current and the first current supplied to each means from the plurality of second current supply means and from the plurality of first current supply means. When the driving means makes the plurality of second current supply means generate the predetermined second currents at predetermined timing to make the plural laser emitting means emit the laser beams in time division, each of the laser beams emitted in time division from the plural laser emitting means is monitored by one laser monitor means to detect each emitted light amount, and each of the output currents from the first current supply means and second current supply means is adjusted by the current adjusting means according to the plural detection results. Since the supply of current to the laser emitting means not driven is stopped by the current control means when the plural laser emitting means are driven in time division and their laser light amounts are detected by one laser monitor means as described above, the laser emitting means not driven, however, are prevented from emitting a small amount of light when only one of the plural laser emitting means is driven for the measurement of light amount.

The present invention also provides the above-stated laser driving apparatus wherein said current control means comprises: at least one third current supply means for generating a current for canceling out a current near a laser emission threshold, generated by said first current supply means and said second current supply means; and a plurality of switching means for connecting said third current supply means to said plurality of laser emitting means each so as to be freely switched on and off.

Accordingly, the third current supply means for generating the current for canceling out the current near the laser emission threshold, generated by the first current supply means and the second current supply means, is connected to the plural laser emitting means by the plural switching means each so as to be freely turned on and off, whereby the supply of current to the laser emitting means not driven is stopped by the current control means. Namely, the supply of the current near the laser emission threshold to the laser emitting means is turned on and off at high speed without turning on and off the connection of the laser emitting means to the first current supply means and the second current supply means.

The present invention also provides the above-stated laser driving apparatus wherein the first current supply means are comprised of slow starter power supplies. Therefore, the first current supply means do not generate too high inrush currents as pulse currents, whereby the laser emitting means can be protected well. Since the connection is not turned on and off between the laser emitting means and the first current supply means in order to turn on and off the supply of the current near the laser emission threshold to the laser emitting means at high speed, the first current supply means can supply the pulse current without a delay even if they are comprised of the slow starter power supplies.

An image-forming apparatus of the present invention comprises the laser driving apparatus described above, data supply means for supplying image data as the control signal to said signal input means; beam deflecting means for deflecting the plural laser beams emitted from said laser driving apparatus to effect scanning in a main scanning direction according to the control signal supplied from said data supply means; latent image carrying means arranged to be exposed to and scanned with the plural laser beams under deflection scanning carried out by said beam deflecting means; sub-scanning means for moving said latent image carrying means relative to said beam deflecting means in a sub-scanning direction; latent image developing means for developing a latent image formed on said latent image carrying means with toner; toner transferring means for transferring the toner on said latent image carrying means, developed by said latent image developing means, onto a recording medium; and toner fixing means for fixing the toner transferred onto the recording medium by said toner transferring means.

In the image-forming apparatus of the present invention, therefore, the data supply means supplies the image data as a control signal to the signal input means of the laser driving apparatus of the present invention, so that the laser emitting means of the laser driving apparatus emit the respective laser beams controlled according to the image data. These plural laser beams are deflected by the beam deflecting means to scan in the main scanning direction, the latent image carrying means is exposed to and scanned with the laser beams thus deflected to scan, and the latent image carrying means thus exposed and scanned is moved relative to the beam deflecting means in the sub-scanning direction by the sub-scanning means. The latent image thus formed on the latent image carrying means is developed with the toner by the latent image developing means and the toner thus developed on the latent image carrying means is transferred onto the recording medium by the toner transferring means. The toner transferred onto the recording medium is fixed by the toner fixing means, so that the image corresponding to the image data is formed as a toner image on the recording medium by the electrophotographic method. In the image-forming apparatus of the present invention utilizing the laser driving apparatus of the present invention, the image is formed while the laser beams are controlled according to the image data. Since a plurality of main scanning lines are exposed simultaneously with the plural laser beams, the image of a dot matrix is formed at high speed. The image is formed with high quality, because the emitted light amounts of the plural laser beams are adjusted each properly.

The various means stated in the present invention can be any means that can implement their functions; for example, they permit dedicated hardware, a computer provided with the appropriate functions in the form of programs, functions implemented inside a computer by appropriate programs, a combination of these, and so on.

DETAILED DESCRIPTION OF THE PREFERRED EMBODIMENTS

An embodiment of the present invention will be described referring to FIG. 4 to FIG. 7. In the present embodiment the same portions as in the conventional example described above will be referred to as the same names and the detailed description thereof will be omitted.

Figure 4:
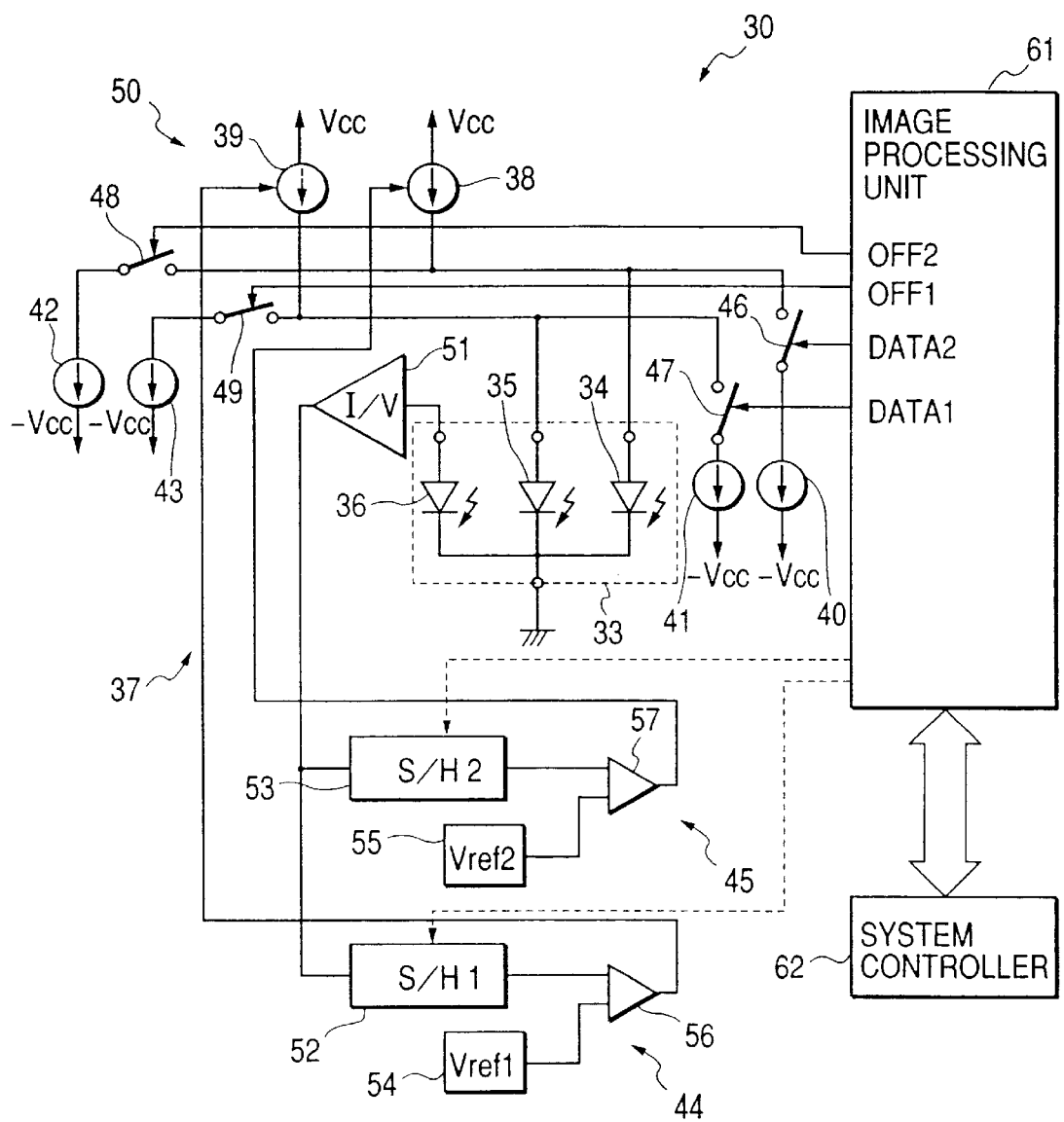
FIG. 4 is a block diagram to show a laser driving apparatus in an embodiment of the present invention.
Figure 5:
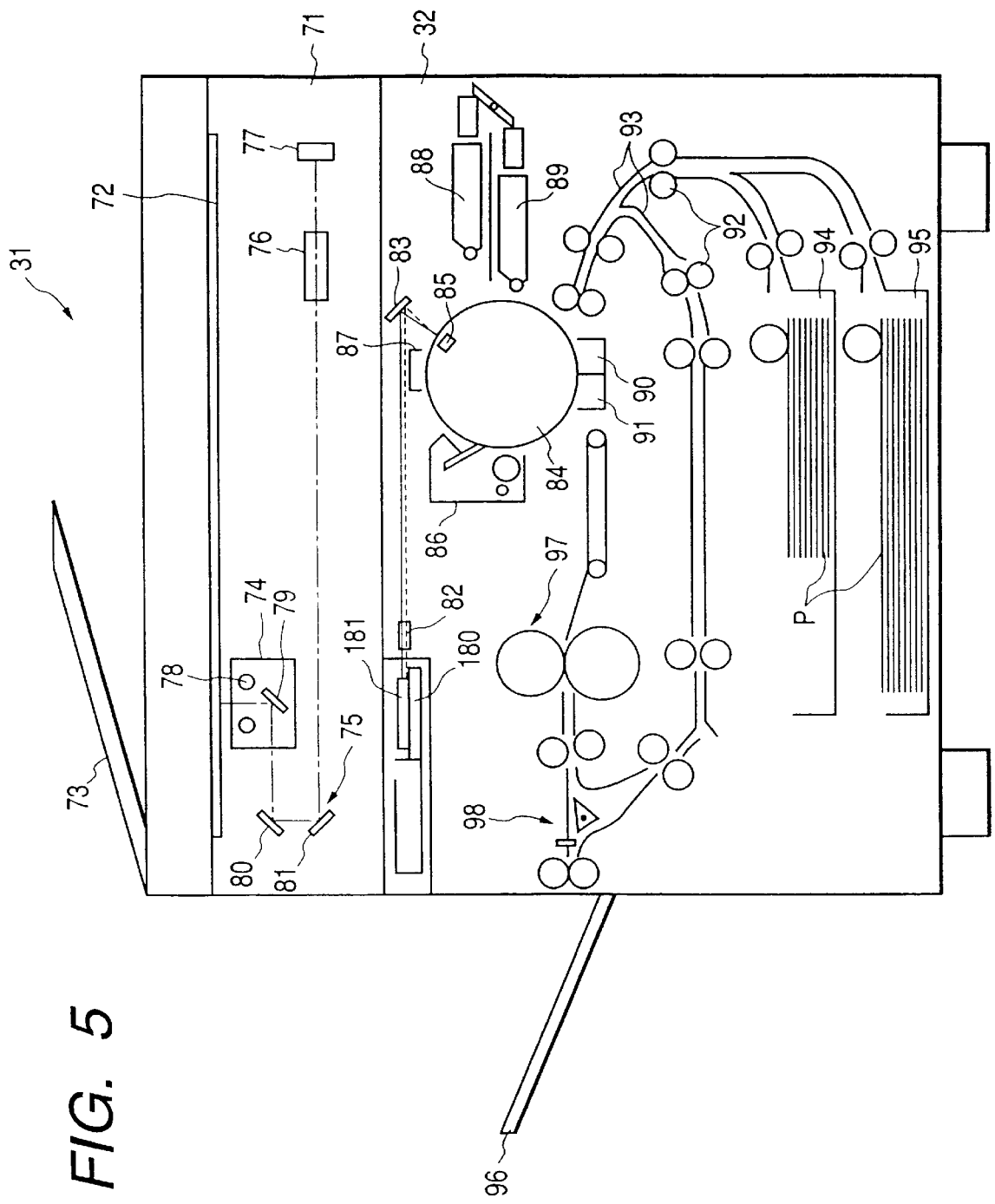
FIG. 5 is a schematic, vertically sectional, side view to show a laser printer as an embodiment of the image-forming apparatus of the present invention.
Figure 6:
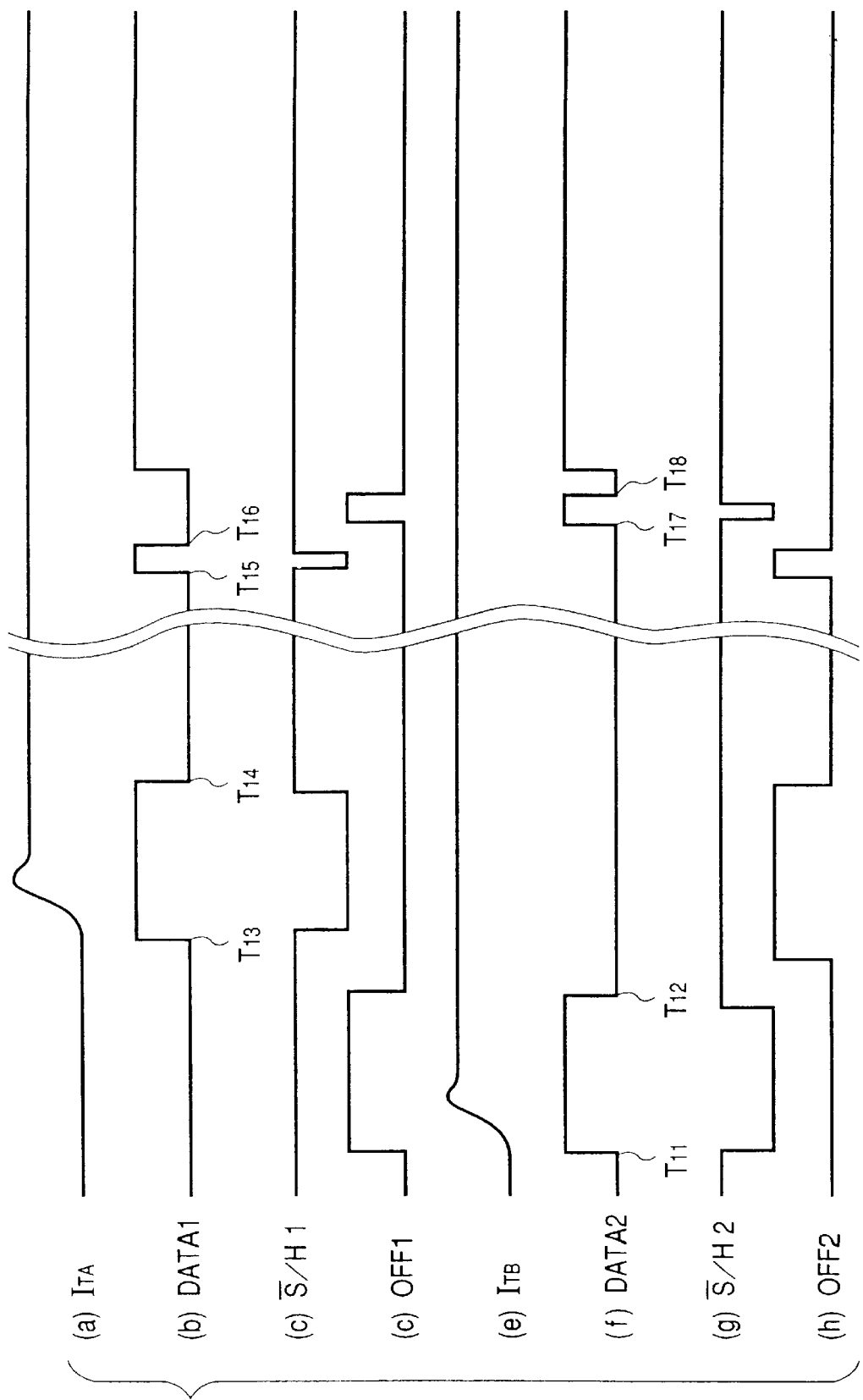
FIG. 6 is a time chart to show the relation among various signals.
Figure 7:
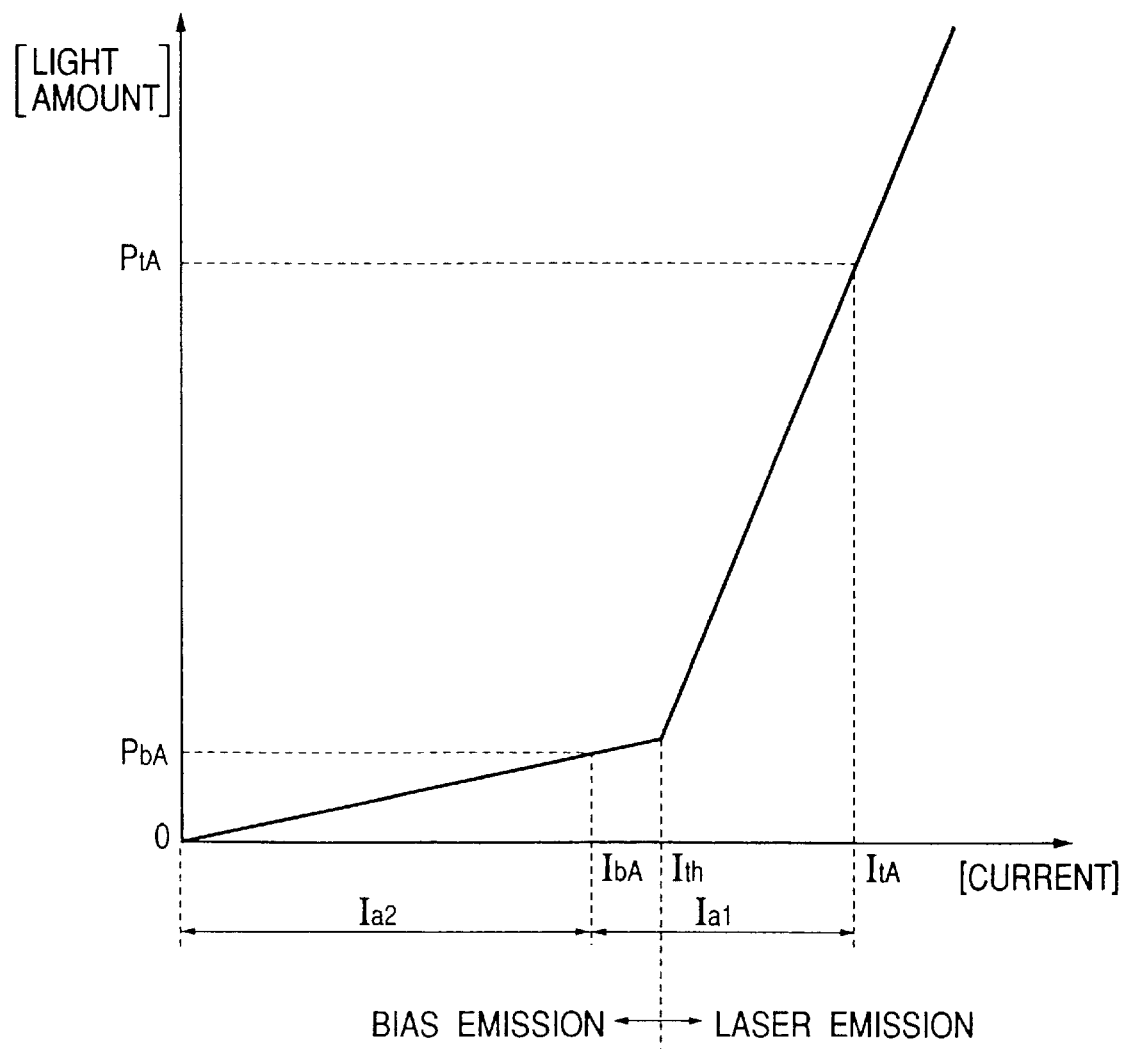
FIG. 7 is a characteristic diagram to show the relationship between current and light amount of the semiconductor laser being laser emitting means.

FIG. 4 is a block diagram to show a laser driving apparatus of the present embodiment and FIG. 5 is a schematic, vertically sectional, side view to show a laser printer which is an image-forming apparatus of the present embodiment. FIG. 6 is a time chart to show the relation among various signals and FIG. 7 is a characteristic diagram to show the relationship between current and light amount of the semiconductor laser which is laser emitting means.

First, the laser driving apparatus 30 of the present embodiment is constructed as part of printer section 32 which is the image-forming device of digital copier 31, and it is provided with a laser device 33 as illustrated in FIG. 4. This laser device 33 is constructed in integral structure comprised of two semiconductor lasers 34, 35, which are plural laser emitting means, and one photodiode 36, which is laser monitor means. They are connected to the laser driver 37.

This laser driver 37 is composed of two bias current sources 40, 41 which are plural bias supply means, two pulse current sources 38, 39 which are plural pulse supply means, two current sources 42, 43 which are plural current supply means, and two APC circuits 44, 45 which are two current adjusting means.

The three types of current sources 38 to 43 two each per type as described above are connected to the two semiconductor lasers 34, 35, one each in each type. More specifically, the pulse current source 38 or 39 is connected directly to the semiconductor laser 34 or 35, respectively, and the bias current source 40 or 41 is connected via a high-speed analog switch 46 or 47, respectively, such as a CMOS or the like, to the semiconductor laser 34 or 35, respectively.

Two analog switches 48, 49 being plural switching means are connected to the respective current sources 42, 43 and each of these analog switches 48, 49 is connected to a middle point of connection between the pulse current source 38, 39 and the semiconductor laser 34, 35, thus forming a current control circuit 50 as current control means.

Each of the two current sources 42, 43 generates a current to cancel out the current near the laser emission threshold supplied to the semiconductor laser 34, 35 by use of the pulse current source 38, 39 and the bias current source 40, 41 and each of the two analog switches 48, 49 connects the current source 42, 43 to the semiconductor laser 34, 35 so as to be freely switched on and off. The pulse current sources 38, 39 are slow starter power supplies not permitting easy high-speed switching whereas the other current sources 40 to 43 are ordinary power supplies permitting easy high-speed switching.

The two APC circuits 44, 45 share a current-voltage converter 51 and each of them has a sample hold circuit 52, 53, a constant voltage supply 54, 55, a comparator 56, 57, etc. They are connected both to one photodiode 36 and respectively to the two pulse current sources 38, 39.

The image processing circuit 61 corresponding to signal input means and continuous driving means is connected to the analog switches 46, 47, which are connected to the respective bias current sources 40, 41, and the system controller 62 is connected to this image processing circuit 61. The image processing circuit 61, which will be detailed hereinafter, is arranged to switch the analog switches 46, 47 on and off according to the image data supplied from the outside as the control signal and also switch the analog switches 48, 49 on and off at such predetermined timing as not to carry out image exposure.

The laser driving apparatus 30 of the structure as described above is used in the printer section 32 of the digital copier 31 as described previously. This digital copier 31 has a scanner section 71 as an image reader, and the printer section 32, these sections being formed integrally, as illustrated in FIG. 5.

The scanner section 71 has contact glass 72 placed horizontally and RDF (Recycle Document Feeder) 73 is disposed on the upper surface of this contact glass 72. There are first, second scanning units 74, 75, a zooming optical system 76, a line sensor 77, etc. disposed below the contact glass 72.

The first scanning unit 74 has fluorescent tubes 78 of a straight tube type and a reflection mirror 79 inclined at 45° and is opposed to the contact glass 72 thereunder as being supported so as to be movable in the sub-scanning direction (from left to right and vice versa in the figure). The second scanning unit 75 has a pair of reflection mirrors 80, 81 opposed each in an inclined state at 45° and is supported so as to be movable at a speed equal to half of that of the first scanning unit 74.

The zooming optical system 76 is supported so as to be freely displaced along the optical axis and is arranged to focus light from a read original (not illustrated) placed on the contact glass 72, after reflected by the above-stated reflection mirrors 79 to 81, at a variable magnification at the position of line sensor 77. This line sensor 77 is composed of many CCDs (Charge Coupled Devices) arrayed in the main scanning direction (or in the direction passing through the figure) and reads to scan the image data in the form of main scanning lines from the read original.

The scanner section 71 of the structure as described above generates image data of a dot matrix comprised of many main scanning lines from the read original. The line sensor 77 of this canner section 71 is connected via various correction circuits (not illustrated) and the like to the image processing circuit 61 of the laser driving apparatus 30 in the printer section 32.

Figure 1:
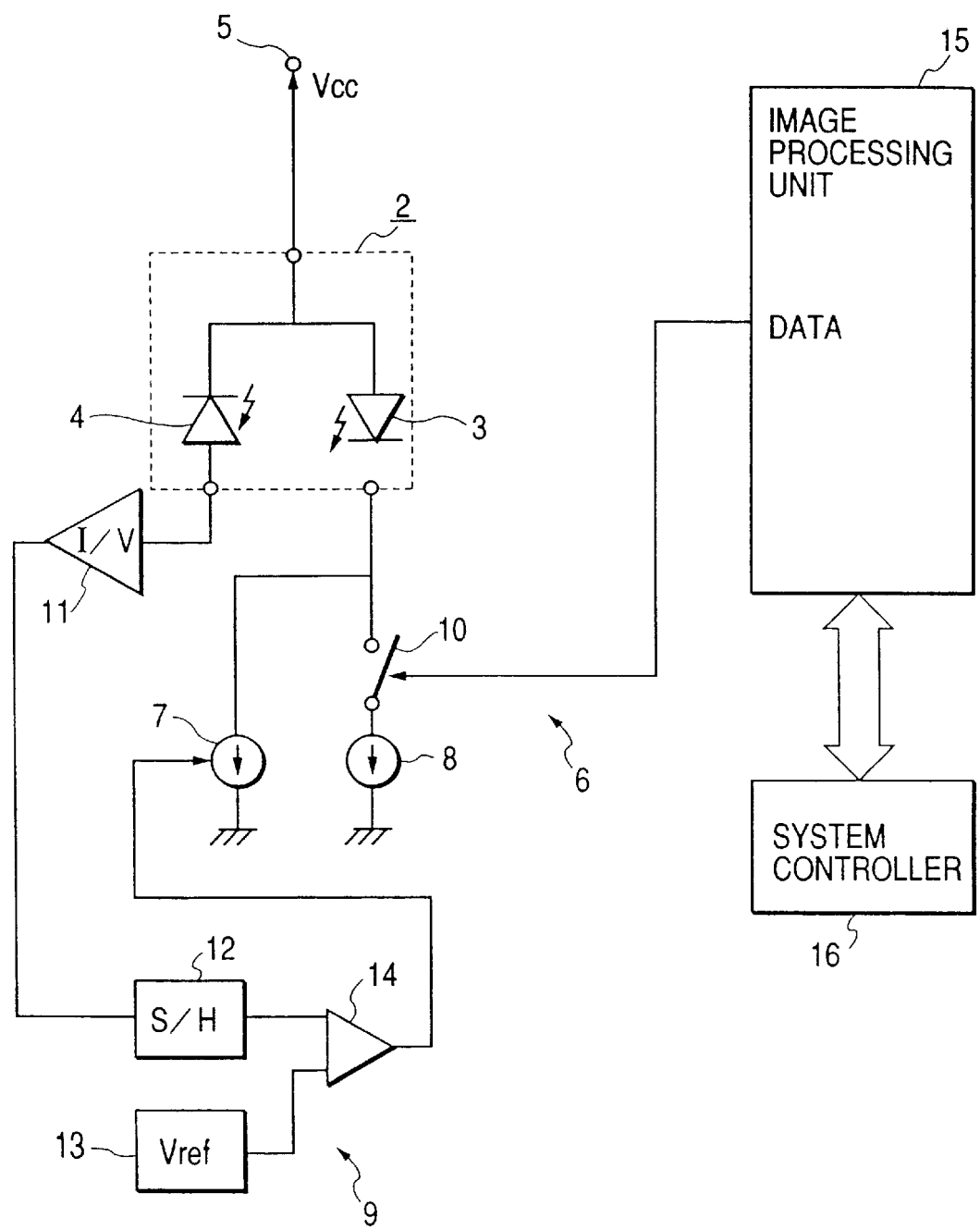
FIG. 1 is a schematic block diagram to show the main part of the image-forming apparatus of the conventional example.
Figure 2:
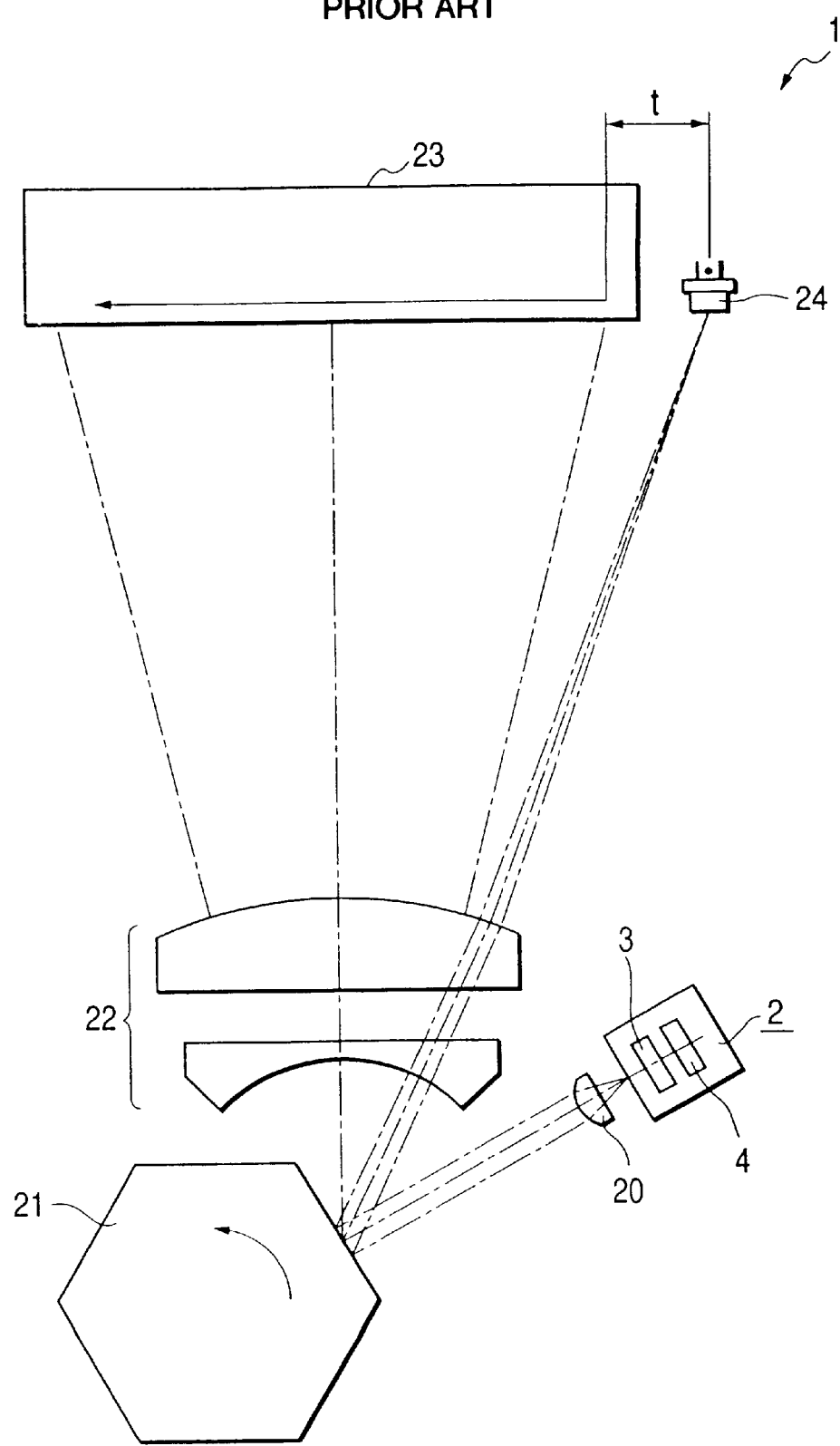
FIG. 2 is a schematic plan view to show part of the optical system of the image-forming apparatus of the conventional example.
Figure 3:
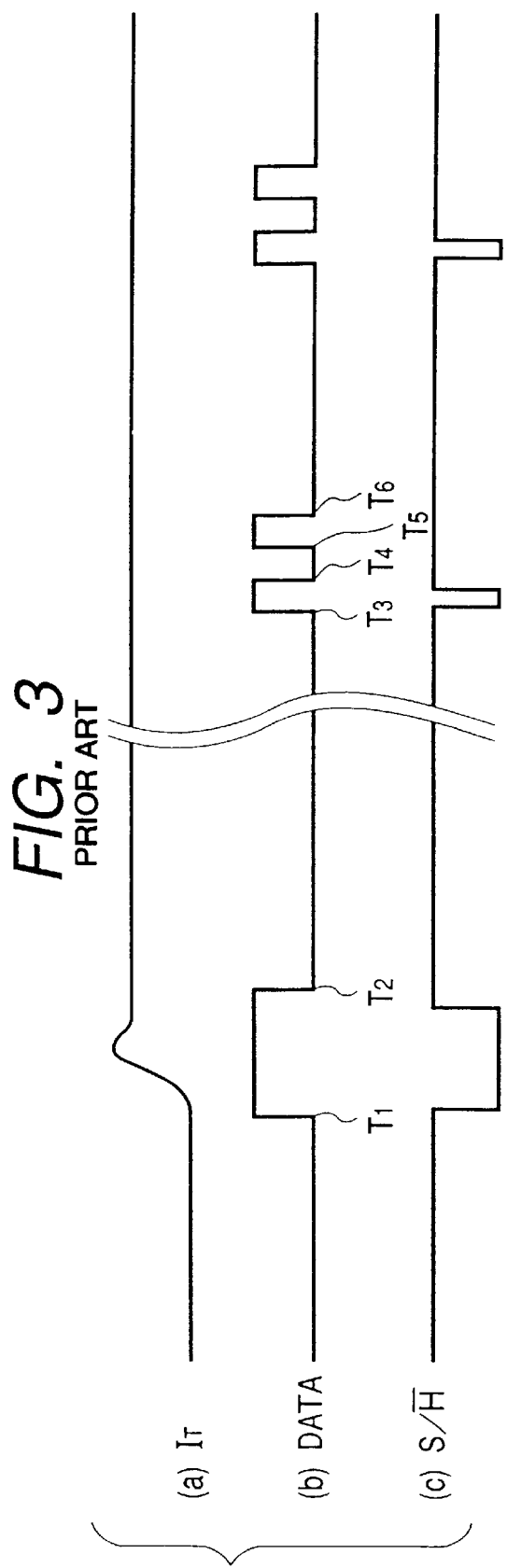
FIG. 3 is a time chart to show the relation among various signals.

The two semiconductor lasers 34, 35 of the laser driving apparatus 30 are arranged up and down, i.e., along the sub-scanning direction in a print image, and are opposed to the reflective surface of the polygon mirror 181 corresponding to beam deflecting means supported so as to be rotatable in the horizontal direction, i.e., in the main scanning direction by scanner motor 180, similarly to the case of the aforementioned conventional example illustrated in FIG. 2.

On the reflected light path of this polygon mirror 81 there is the peripheral surface of the photosensitive drum 84 as latent image carrying means located via a correction optical system 82 of an fθ lens or the like and a reflection mirror 83, and this photosensitive drum 84 is rotatably supported so that the peripheral surface is relatively moved in the sub-scanning direction by the drum driving mechanism (not illustrated) being sub-scanning means.

The BD sensor 85 being beam detecting means is located at a forward position in the main scanning direction with respect to the photosensitive drum 84 in the scanning range of the polygon mirror 81 and this BD sensor 85 is connected, for example, via an amplifier (not illustrated) to the system controller 62.

Around the peripheral surface of the photosensitive drum 84, there are also provided, in addition to the reflection mirror 83 described above, a toner cleaner 86, a charging charger 87 as carrier charging means, developing devices 88, 89 as latent image developing means, a transfer charger 90 as toner transferring means, a peeling charger 91 as medium peeling means, etc. and a conveyance passage of a print sheet P as a recording medium is also formed in the gap between these chargers 90, 91 and the photosensitive drum 84.

This sheet conveyance passage is constructed of many feed rollers 92, guide plates 93, etc. and is in communication with sheet cassettes 94, 95 and with a sheet discharge tray 96. In this sheet conveyance passage there are also a fixing device 97 as toner fixing means and a sheet inverting mechanism 98 as medium inverting means, and another sheet conveyance passage is also created for circulating the print sheet P from this sheet inverting mechanism 98 to the position of the photosensitive drum 84.

As in the case of the aforementioned conventional example, the laser driving apparatus 30 of the present embodiment is arranged so that the system controller 62 controls the operation of the image processing circuit 61, the APC circuits 44, 45, etc. at predetermined timing, as illustrated in FIG. 6. Since the laser driving apparatus 30 of the present embodiment has the two semiconductor lasers 34, 35 and one photodiode 64, the image processing circuit 61 drives the two semiconductor lasers 34, 35 in time division during execution of the APC operation, however.

When the two semiconductor lasers 34, 35 are driven in time division for the APC operation to adjust the light amounts of the two semiconductor lasers 34, 35 in this way, the image processing circuit 61 successively switches the two analog switches 48, 49 of the current control circuit 50 on and off to connect the current source 42, 43 to the semiconductor laser 34, 35 in order, so as to supply the current for canceling out the current near the laser emission threshold from these current sources 42, 43 to the semiconductor lasers 34, 35, thereby terminating emission completely.

In the above-described structure, the digital copier 31 of the present embodiment can read to scan the image data of the dot matrix in the form of many main scanning lines from the read original by the scanner section 71 and print this image data out on the print sheet P in the electrophotographic method by the printer section 32.

In that case, in the laser driving apparatus 30 of the present embodiment, the bias currents supplied from the laser driver 37 to the two semiconductor lasers 34, 35 of the laser device 33 are controlled by the image processing circuit 61 according to the image data supplied from the scanner section 71.

Namely, the image processing circuit 61 controls on/off of the analog switches 46, 47 of the bias current sources 40, 41 according to the image data while the pulse currents are always supplied from the pulse current sources 38, 39 to the respective semiconductor lasers 34, 35. This turns the bias currents on and off under application of the pulse currents, so that the semiconductor lasers 34, 35 emit the laser beams in predetermined light amounts controlled according to the image data.

The two laser beams respectively emitted according to the image data by the two semiconductor lasers 34, 35 are simultaneously deflected to scan in the main scanning direction by the rotating polygon mirror 81, thereby irradiating the peripheral surface of the photosensitive drum 84 rotating in the sub-scanning direction. At this time, since the photosensitive drum 84 is charged in the peripheral surface by corona discharge of the charging charger 87, an electrostatic latent image is formed here in the form of many main scanning lines by exposure scanning of the laser beams.

The electrostatic latent image formed on the peripheral surface of the photosensitive drum 84 in this way is developed with toner supplied from one of the two developing devices 88, 89 and this developed toner is transferred onto the print sheet P conveyed from the sheet supply cassette 94 or the like by a potential generated by the transfer charger 90. Since the print sheet P to which the toner was transferred in this way is heated and pressed to be fixed by the fixing device 97, this completes the formation of image by the printer section 32 of the digital copier 31.

Since the digital copier 31 of the present embodiment controls the laser beams according to the image data, it can form the print image of the dot matrix. At this time, the two semiconductor lasers 34, 35 from two main scanning lines each time, and the print image comprised of many main scanning lines can be formed at high speed.

Since the two laser beams deflected to scan are detected simultaneously by the BD sensor 85 immediately before the irradiation of the photosensitive drum 84, the start positions of the many main scanning lines succeeding in the sub-scanning direction are aligned by carrying out the emission of the laser beams according to the image data at a predetermining time after this beam detection of the BD sensor 85.

Since the laser beams need to be detected by the BD sensor 85 prior to the image scanning in this way, the two semiconductor lasers 34, 35 are driven by the system controller 62 and the image processing circuit 61 at the timing when the laser beams under the deflection scanning irradiate the BD sensor 85.

The two semiconductor lasers 34, 35 are driven in time division for the APC operation immediately before the laser beams are detected by the BD sensor 85. The emitted light amounts are detected in time division by one photodiode 36 and the pulse currents of the pulse current sources 38, 39 are adjusted individually by the two APC circuits 44, 45 of the laser driver 37.

In the laser driving apparatus 30 of the present embodiment, however, when the two semiconductor lasers 34, 35 are driven in time division for the APC operation as described above, the image processing circuit 61 switches the analog switches 46, 47 of the bias current sources 40, 41 on and off by the DATA signal and, at the same time as it, also switches the analog switches 48, 49 of the current sources 42, 43 on and off.

FIG. 6 is a time chart to show the relation among the various signals and FIG. 7 is a characteristic diagram to show the relationship between current and light amount of the semiconductor laser as laser emitting means.

As illustrated in FIG. 6, the APC operation of the semiconductor laser 34 is carried out first.

The pulse current $I_{TB}$ is supplied from the pulse current supply 38 to the semiconductor laser 34 to effect such adjustment by the APC circuit 45 in the time period "$T_{11}$ to $T_{12}$" as to make the pulse current $I_{TB}$ of the pulse current source 38 equal to the initial value $I_{tA}$ shown in FIG. 7. At this time the two analog switches 46, 48 are off, so that the bias current (current $I_{a1}$) and the predetermined current (current $I_{a2}$) are not applied to the semiconductor laser 34. At this time the pulse current $I_{TA}$ of the pulse current source 39 is not applied to the other semiconductor laser 35. At this time the two analog switches 47, 49 are on, but the bias current is canceled out by the predetermined current. Therefore, no current is supplied to the other semiconductor laser 35, so as to effect no emission.

The APC operation of the semiconductor laser 35 is carried out next. The pulse current $I_{TA}$ is supplied from the pulse current source 39 to the semiconductor laser 35 to effect such adjustment by the APC circuit 44 in the time period "$T_{13}$ to $T_{14}$" as to make the pulse current $I_{TA}$ of the pulse current source 39 equal to the initial value $I_{tA}$ shown in FIG. 7. At this time the two analog switches 47, 49 are off, so that the bias current (current $I_{a1}$) and the predetermined current (current $I_{a2}$) are not applied to the semiconductor laser 35. At this time the pulse current $I_{TB}$ of the pulse current supply 38 is applied to the other semiconductor 34, but the two analog switches 46, 48 are on at this time, so that the aforementioned pulse current $I_{TB}$ is canceled out by the bias current and the predetermined current. Therefore, the current is not supplied to the other semiconductor laser 34, so as to effect no emission.

The APC operation of the semiconductor lasers as described above is also carried out similarly in the time period "$T_{15}$ to $T_{16}$" and in the time period "$T_{17}$ to $T_{18}$."

After completion of the APC operation, the pulse current and bias current are applied to the semiconductor lasers, so that the semiconductor lasers are made to stand by in a state of a current $I_{bA}$ as a result of subtraction of the bias current (current $I_{a1}$) from the pulse current (current $I_{tA}$). This current $I_{bA}$ is a value near the laser emission threshold current $I_{th}$.

In the laser driving apparatus 30 of the present embodiment, therefore, when the two semiconductor lasers 34, 35 are driven one by one in time division for the APC operation, the other laser not driven is prevented from emitting a small amount of light because of the current near the laser emission threshold. Therefore, the emitted light amounts of the two semiconductor lasers 34, 35 can be detected accurately by one photodiode 36 and the pulse currents of the two pulse current sources 38, 39 can be adjusted each properly by the APC circuits 44, 45.

Since the laser driving apparatus 30 of the present embodiment can properly adjust each of the laser light amounts of the two semiconductor lasers 34, 35 as described above, the digital copier 31 of the present embodiment utilizing it can form the image with good quality and at high speed.

Particularly, since the laser driving apparatus 30 of the present embodiment uses the pulse current sources 38, 39 of the slow starter power supplies, the semiconductor lasers 34, 35 can be protected well. Although the pulse current supplies 38, 39 comprised of the slow starter power supplies in this way cannot be switched on and off at high speed, the supply of bias currents to the semiconductor lasers 34, 35 can be turned properly on and off, because the bias current sources 40, 41 are connected to the semiconductor lasers 34, 35 by the analog switches 46, 47.

It is noted that the present invention is by no means intended to be limited to the above embodiment, but the present invention embraces a variety of modifications within the scope not departing from the spirit of the invention. For example, the above embodiment exemplified the adjustment of only the pulse current for the APC operation, but it is also possible to adjust the bias current or to adjust the both currents. In addition, the above embodiment exemplified the two semiconductor lasers 34, 35 as plural laser emitting means, but the plural laser emitting means can also be three or more semiconductor lasers.

The present invention presents the effects described below because of the structure as described above.

The laser driving method of the present invention is arranged so that when the plural laser emitting means are continuously driven in time division during the adjustment of light amount, the supply of current is stopped to the laser emitting means not driven, whereby when only one of the plural laser emitting means is driven for the measurement of light amount, the laser emitting means not driven are prevented from emitting a small amount of light because of the current near the laser emission threshold; therefore, the emitted light amounts of the plural laser emitting means can be detected accurately by one laser monitor means and the emitted light amounts can be corrected properly by properly adjusting the bias current and pulse current of each of the plural laser emitting means.

The laser driving apparatus of the present invention comprises signal input means through which a control signal is supplied from the outside, a plurality of second current supply means for generating a second current controlled according to the control signal supplied from the outside through the signal input means, when necessary, a plurality of first current supply means for always generating a first current, a plurality of laser emitting means for individually emitting a laser beam according to the second current and the first current supplied respectively from either of the plurality of second current supply means and from either of the plurality of first current supply means, driving means for making the plurality of second current supply means generate the predetermined second current at predetermined timing to make the plurality of laser emitting means emit respective laser beams in time division, one laser monitor means for monitoring each of the laser beams which the driving means makes the plurality of laser emitting means emit in time division, to detect an emitted light amount of each beam, current adjusting means for individually adjusting an output current from at least either the first current supply means or the second current supply means according to plural detection results of the laser monitor means, and current control means for stopping supply of the current to the laser emitting means not driven when the plurality of laser emitting means are driven in time division by the driving means, whereby the laser emitting means not driven are prevented from emitting a small amount of light when only one of the plural laser emitting means is driven for the measurement of light amount; therefore, the emitted light amounts of the plural laser emitting means can be detected accurately by one laser monitor means and the emitted light amounts of the plural laser emitting means can be corrected properly by properly adjusting the output currents from the plural first current supply means and second current supply means.

The present invention also provides the above-stated laser driving apparatus wherein the current control means comprises at least one third current supply means for generating a current to cancel out a current near the laser emission threshold, generated by the first current supply means and the second current supply means, and a plurality of switching means for connecting the third current supply means to the plurality of laser emitting means each so as to be freely switched on and off, whereby the supply of current to the laser emitting means can be turned on and off at high speed without turning the connection between the laser emitting means and the first current supply means on and off.

The present invention also provides the above-described laser driving apparatus wherein the first current supply means are comprised of slow starter power supplies, whereby the laser emitting means can be protected well.

The image-forming apparatus of the present invention comprises the above-described laser driving apparatus, data supply means for supplying image data as a control signal to the signal input means of the laser driving apparatus, beam deflecting means for deflecting a plurality of laser beams emitted from the laser driving apparatus to effect scanning in the main scanning direction according to the control signal supplied from the data supply means, latent image carrying means arranged to be exposed to and scanned with the plurality of laser beams under the deflection scanning carried out by the beam deflecting means, sub-scanning means for moving the latent image carrying means relative to the beam deflecting means in the sub-scanning direction, latent image developing means for developing a latent image formed on the latent image carrying means with toner, toner transferring means for transferring the toner on the latent image carrying means, developed by the latent image developing means, onto a recording medium, and toner fixing means for fixing the toner transferred onto the recording medium by the toner transferring means, whereby the emitted light amounts of the plural laser beams can be adjusted each properly, so that the image can be formed with high quality.

What is claimed is:

1. A laser driving method for driving a plurality of laser emitting means, the laser driving method comprising the following steps:

a step of always generating a first current to be supplied to each of the plurality of laser emitting means;

a step of generating a plurality of second currents controlled according to a control signal supplied from the outside, when necessary;

a step of supplying said plurality of second currents to the respective laser emitting means under supply of the respective first currents, thereby making the laser emitting means emit respective laser beams;

a step of making said plurality of laser emitting means emit the laser beams in time division at predetermined timing, and detecting each of emitted light amounts by one laser monitor means;

a step of adjusting at least one of the first current and the second current supplied to each of said plurality of laser emitting means according to a plurality of detected light amounts detected; and a step of stopping supply of the current to the laser emitting means not driven when said plurality of laser emitting means are adjusted in light amount in time division.

2. A laser driving apparatus comprising:

signal input means through which a control signal is supplied from the outside;

a plurality of second current supply means for generating a second current controlled according to the control signal supplied from the outside through said signal input means, when necessary;

a plurality of first current supply means for always generating a first current;

a plurality of laser emitting means for individually emitting a laser beam according to the second current and the first current supplied respectively from either of said plurality of second current supply means and from either of said plurality of first current supply means;

driving means for making said plurality of second current supply means generate the predetermined second current at predetermined timing to make said plurality of laser emitting means emit respective laser beams in time division;

one laser monitor means for monitoring each of the laser beams which said driving means makes said plurality of laser emitting means emit in time division, to detect emitted light amounts of the respective laser beams;

current adjusting means for individually adjusting an output current from at least either said first current supply means or said second current supply means according to a plurality of detection results of said laser monitor means; and current control means for stopping supply of the current to the laser emitting means not driven when said driving means drives said plurality of laser emitting means in time division.

3. The laser driving apparatus according to claim 2, wherein said current control means comprises:

at least one third current supply means for generating a current for canceling out a current near a laser emission threshold, generated by said first current supply means and said second current supply means; and a plurality of switching means for connecting said third current supply means to said plurality of laser emitting means each so as to be freely switched on and off.

4. The laser driving apparatus according to claim 3, wherein said first current supply means are comprised of slow starter power supplies.

5. An image-forming apparatus comprising:

signal input means through which a control signal is supplied from the outside;

a plurality of second current supply means for generating a second current controlled according to the control signal supplied from the outside through said signal input means, when necessary;

a plurality of first current supply means for always generating a first current;

a plurality of laser emitting means for individually emitting a laser beam according to the second current and the first current supplied respectively from either of said plurality of second current supply means and from either of said plurality of first current supply means;

driving means for making said plurality of second current supply means generate the predetermined second current at predetermined timing to make said plurality of laser emitting means emit respective laser beams in time division;

one laser monitor means for monitoring each of the laser beams which said driving means makes said plurality of laser emitting means emit in time division, to detect emitted light amounts of the respective laser beams;

current adjusting means for individually adjusting an output current from at least either said first current supply means or said second current supply means according to a plurality of detection results of said laser monitor means;

current control means for stopping supply of the current to the laser emitting means not driven when said driving means drives said plurality of laser emitting means in time division;

data supply means for supplying image data as the control signal to said signal input means;

beam deflecting means for deflecting the plural laser beams emitted from the plurality of laser emitting means to effect scanning in a main scanning direction according to the control signal supplied from said data supply means;

latent image carrying means arranged to be exposed to and scanned with the plural laser beams under the deflection scanning carried out by said beam deflecting means;

sub-scanning means for moving said latent image carrying means relative to said beam deflecting means in a sub-scanning direction;

latent image developing means for developing a latent image formed on said latent image carrying means with toner;

toner transferring means for transferring the toner on said latent image carrying means, developed by said latent image developing means, onto a recording medium; and toner fixing means for fixing the toner transferred onto the recording medium by said toner transferring means.

6. A laser driving method for driving a plurality of laser emitting means, the laser driving method comprising the following steps:

a step of generating a first current to be supplied to the plurality of laser emitting means;

a step of generating a plurality of second currents modulated by a control signal;

a step of supplying said plurality of second currents to the respective laser emitting means in addition to the respective first currents;

a step of making at least one of said plurality of laser emitting means emit laser beams independently;

a step of detecting light amounts emitted in said making step;

a step of adjusting at least one of the first current and the second current according to a detected light amount; and a step of stopping supply of the current to the laser emitting means not emitting laser beams in said making step.

7. A laser driving apparatus for driving a plurality of laser emitting means, comprising:

means for generating a first current to be supplied to the plurality of laser emitting means;

means for generating a plurality of second currents modulated by a control signal;

means for supplying said plurality of second currents to the respective laser emitting means in addition to the respective first currents;

means for making at least one of said plurality of laser emitting means emit laser beams independently;

means for detecting light amounts emitted by said making means;

means for adjusting at least one of the first current and the second current according to a detected light amount; and means for stopping supply of the current to the laser emitting means not emitting laser beams during the period for light emission by said making means.

* * * * *